United States Patent [19]

Hall et al.

[11] 4,216,717
[45] Aug. 12, 1980

[54] SCREEN PRINTING APPARATUS

[75] Inventors: Charles E. Hall; Royston Moore, both of Weymouth, England

[73] Assignee: DEK Printing Machine Limited, Granby Industrial Estate, Great Britain

[21] Appl. No.: 892,372

[22] Filed: Mar. 31, 1978

[30] Foreign Application Priority Data

Apr. 1, 1977 [GB] United Kingdom ............ 13871/77

[51] Int. Cl.² ............ B41F 15/42; F16H 25/10; F16H 25/20
[52] U.S. Cl. ............ 101/123; 74/57; 74/110; 101/127.1
[58] Field of Search ............ 101/116–124, 101/126, 129; 118/213; 74/25, 57, 110

[56] References Cited

U.S. PATENT DOCUMENTS

| | | | |
|---|---|---|---|
| 855,434 | 5/1907 | McAtlin | 74/25 |
| 1,589,546 | 6/1926 | Nichols | 101/123 |
| 1,776,459 | 9/1930 | Tull | 101/123 |
| 2,125,837 | 8/1938 | Schneider | 101/124 |
| 2,267,596 | 12/1941 | Montague | 101/123 |
| 2,581,775 | 1/1952 | Wade | 101/123 |
| 2,894,451 | 7/1959 | Landesman | 101/126 |
| 3,264,980 | 8/1966 | Rudolph | 101/123 |

FOREIGN PATENT DOCUMENTS 14851 of 1915 United Kingdom ............ 101/169
517729 7/1976 U.S.S.R. ............ 74/25

*Primary Examiner*—Clyde I. Coughenour
*Attorney, Agent, or Firm*—Fidelman, Wolffe & Waldron

[57] ABSTRACT

Screen printing apparatus incorporating drive means for a squeegee comprising a drive motor, a lead screw rotatable by the motor and a rider for the lead screw, said rider being coupled to a mounting for the squeegee preferably through stroke adjustment means and the lead screw having two oppositely handed threads thereon such that rotation of the motor causes reciprocating motion of the rider longitudinally of the lead screw at substantially uniform speed.

Adjusting means to adjust the distance between two members such as a printing head of screen printing apparatus and a table on which articles to be printed can be laid, comprising a pair of coaxial shafts, eccentric members secured on the shafts, bushes secured to respective ones of said members and means to rotate the shaft such that the eccentrics when rotated in the bushes cause the members to move relatively to one another by the sum of the eccentricity of the two eccentrics having regard to the angle through which they are rotated.

5 Claims, 5 Drawing Figures

FIG. 1.

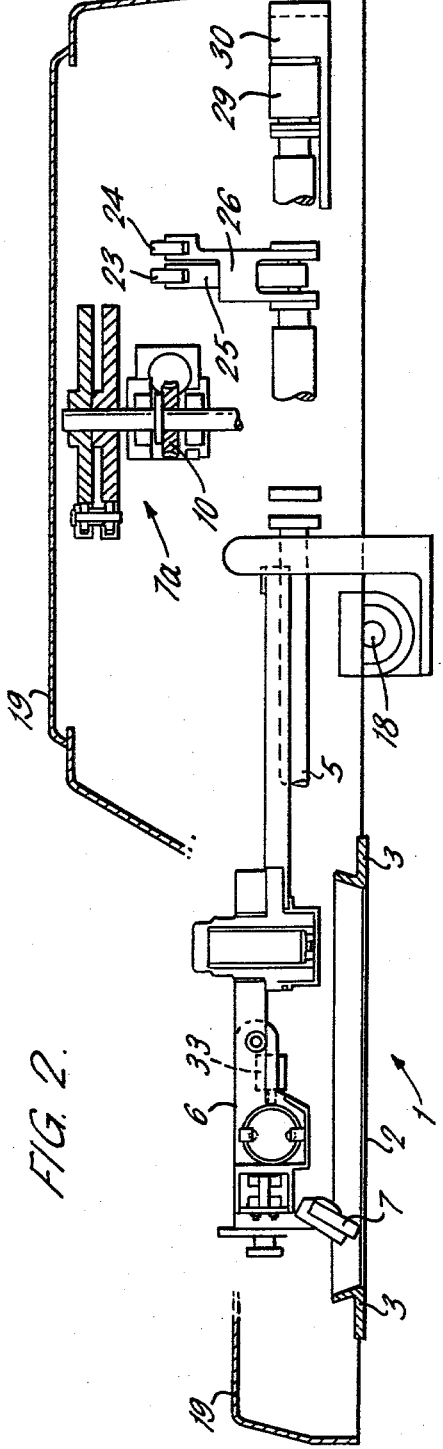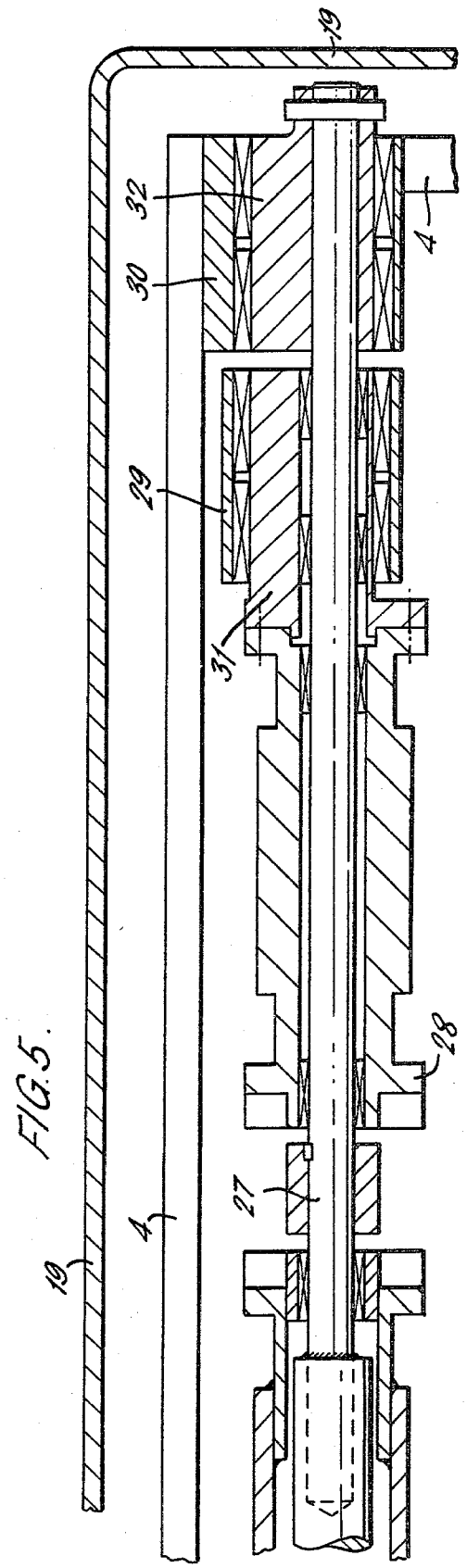

SCREEN PRINTING APPARATUS

The invention relates to screen printing apparatus.

true linear motion of the squeegee can be important in precision screen printing apparatus, for example screen printing apparatus used to print rare metal ink deposits on substrates to form printed circuits.

Screen printers are known in which the squeegee is moved with simple harmonic motion, for example the DEK 1200 printer. Printers with pneumatic drives for the squeegee have also been proposed but a pneumatic drive can only produce a truly linear motion for a part of the travel of the squeegee. An hydraulic drive can provide substantially constant speed but apparatus utilising an hydraulic drive is difficult to keep clean since there is a likelihood of an oil mist being given off following each operation and an oil film on a substrate is not conducive to successful printing.

The speed of travel of the squeegee is important if a uniform and determined thickness of deposit is to be obtained. Generally speaking, the higher the speed of the squeegee the lower the pressure exerted by the squeegee on the screen since the blade of the squeegee tends to trail rearwardly from its mounting, having regard to its direction of motion, to an extent proportional to its speed of travel.

Variation of the height of a printing head of screen printing apparatus relative to a deck on which articles such as substrates are located to be printed is desirable to allow printing on articles of different thicknesses and it is important that the printing head and the deck be maintained accurately settable for a printing operation and that the distance be resettable to the same value following an intermediate operation at another value.

According to one aspect of the invention screen printing apparatus incorporates drive means for a squeegee comprising a drive motor, a lead screw rotatable by the motor and a rider for the lead screw, said rider being coupled to a mounting for the squeegee, the lead screw having two oppositely handed threads thereon such that rotation of the motor causes reciprocating motion of the rider longitudinally of the lead screw at substantially uniform speed.

Advantageously the mounting for the squeegee comprises a carriage reciprocable on parallel spaced rails and the rider is coupled to the carriage by way of stroke adjustment means.

The stroke adjustment means may comprise a member pivotally mounted on the carriage and having a slot therein in which the rider can be reciprocated, pivotal movement of the pivotal member with respect to the longitudinal extent of the lead screw being effective to adjust the angle of the slot relative to the direction of travel of the rider on the lead screw and thus the stroke of the carriage and of the squeegee with respect to the stroke of the rider on the lead screw.

According to another aspect of the invention adjusting means to adjust the distance between two members comprises a pair of coaxial shafts, eccentric members secured on said shafts, bushes secured to respective ones of said members and means to rotate the shafts such that the eccentrics when rotated in the bushes cause the members to move relatively to one another by the sum of the eccentricity of the two eccentrices, having regard to the angle through which they are rotated.

Such adjusting means may be used to adjust the spacing of a printing head of screen printing apparatus from a table on which articles to be printed can be laid but has other applications, where fine adjustment is required, for example spacing of a mounting of laser of a laser trimmer from articles to be trimmed by the laser.

Preferably two such pairs of coaxial shafts are provided in parallel to cause a frame comprising one of the members to move in parllel with and away from or towards a frame or housing comprising the other of the members.

The means to cause rotation of the shafts preferably comprises generally radially extending projections from the shafts coupled to tie rods engaged with a motor driven gear arrangement.

The invention is diagrammatically illustrted by way of example in the accompanying drawings, in which:

Figure 1:
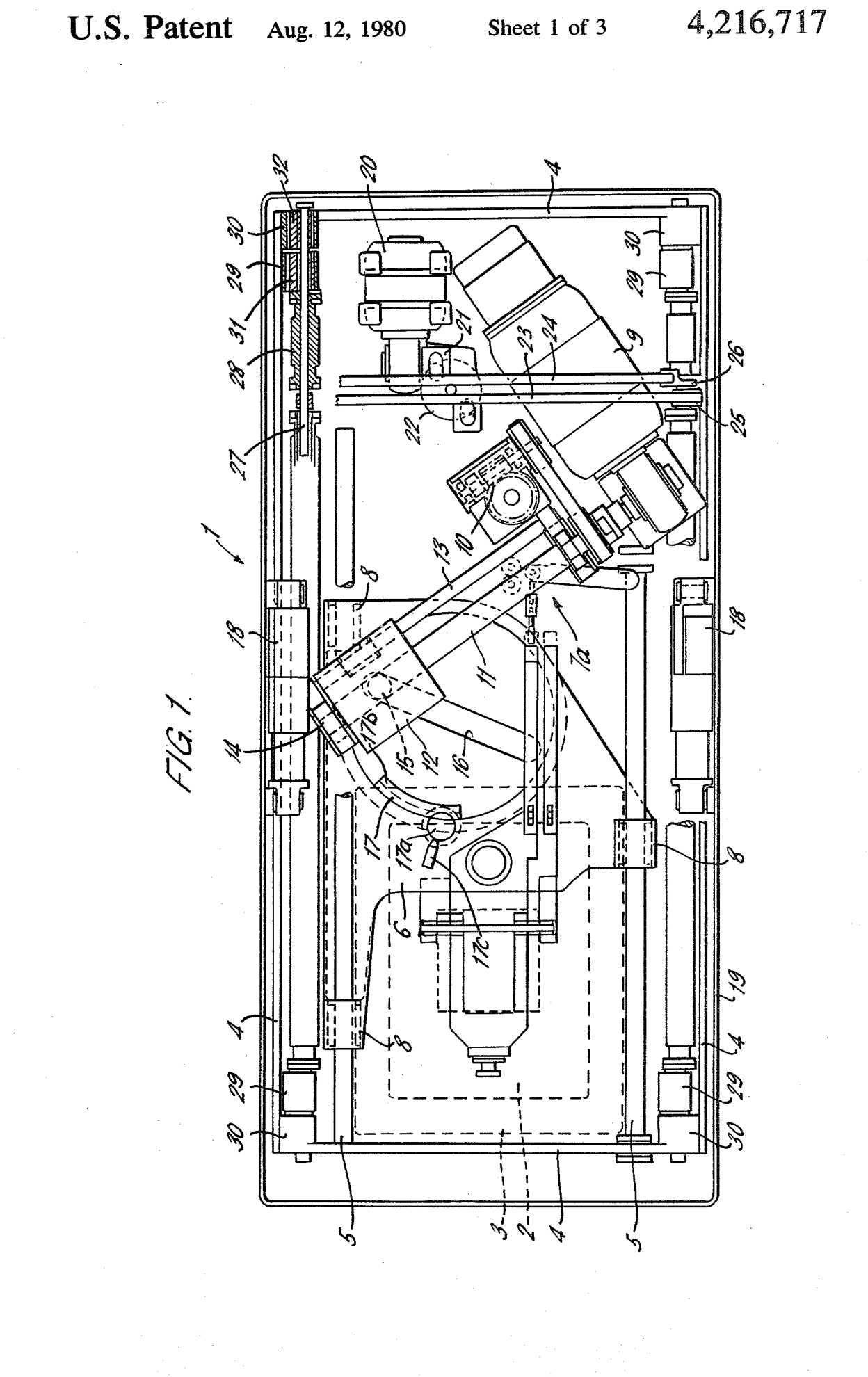

FIG. 1 is a plan view of screen printing apparatus according to the invention;

FIG. 2 is a schematic sectional side views corresponding to FIG. 1;

FIG. 5 shows a portion of FIG. 1 at the top righthand corner thereof to a greater scale.

Figure 3:
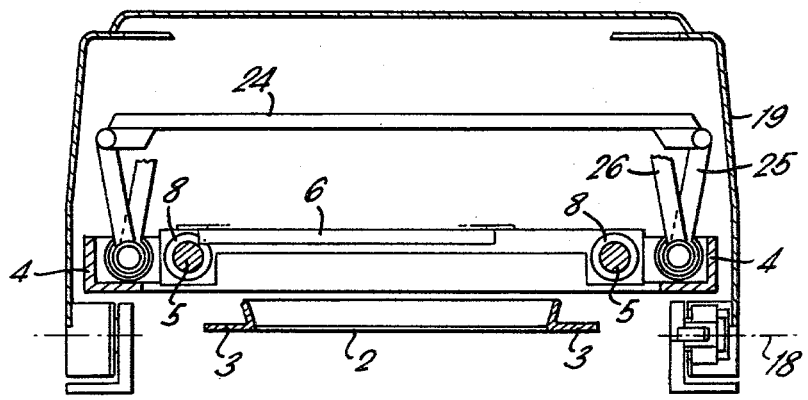
FIGS. 3 and 4 are schematic sectional front views of the apparatus of FIGS. 1 and 2.
Figure 4:
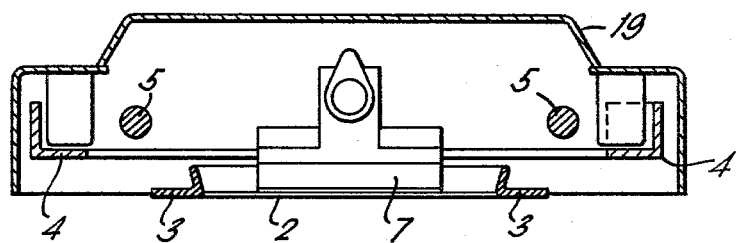

Referring to the drawings, screen printing apparatus 1, to overlie a deck or table on which articles to be printed can be laid, comprises a printing screen 2 mounted in a frame 3. A further frame 4 mounts a pair of parallel rods 5 on which a carriage 6 is reciprocable, the carriage 6 mounting a squeegee 7 (FIG. 2). The carriage 6 is slidably mounted on the parallel rods 5 by three slide bearings 8, the carriage 6 preferably being capable of a maximum travel of 160 mm, 105 mm of which can be used for printing. Preferably the carriage 6 also mounts a distributor blade (not shown) but arranged, in known manner, so that upon a stroke of the carriage 6 in one direction the squeegee effects a printing stroke, the squeegee blade rising at the end of the printing stroke and the distributor blade, to distribute ink evenly over the screen, falling and being effective on the return stroke in the other direction. The frame 3 mounting the screen 2 is maintained stationary and the natural deflection of the screen 2 after the squeegee 7 has passed thereover, causes it to peel away from the article which it has printed, leaving transferred ink from the screen as print on the article.

The travel of the carriage 6 is caused by an electric motor 9 which through a worm gear arrangement 10 causes rotation of a lead screw 11 in a constant direction of rotation.

A rider block 12 is slidable on the lead screw 11 and constrained from rotation therearound by a guide rail 13 extending parallel to the lead screw 11, the rider block 12 mounting a needle roller which engages the thread of the lead screw 11. Two such threads, oppositely handed to one another, are provided on the lead screw 11 such that at a start position the needle roller is edgaged in one of the threads and upon rotation of the lead screw moves outwardly therealong away from the motor 9. As it approaches a free end mounting block 14 for the lead screw 11 and the guide rail 13, the needle roller switches into the other of the threads so that continued rotation of the lead screw 11 causes the rider block 12 to return along the lead screw 11 towards the motor 9. As it approaches the near end mounting of the lead screw 11 it again switches into said one of the threads to be moved outwardly again along the lead screw 11.

The rider block 12 mounts a roller 15 engaged in a slot 16 in a disc 17 mounted on the carriage 6. The disc 17 is rotatably mounted on the carriage 6 and can be rotated, from the maximum stroke position shown, anticlockwise to a minimum stroke position in which the slot 16 extends substantially parallel with the lead screw 11. Locking means (not shown) are provided to secure the disc 17 to the carriage 6 at any rotational position to which it is adjusted. In the position shown in FIGS. 1 and 2 the rider block 12 is at the extreme free end of the lead screw 11 and the squeegee 7 is therefore fully advanced. Return movement of the rider block 12 towards the motor 9 will cause the roller 15 to move along the slot 16 in the disc 17 to retract the carriage 6, that is to say move it rightwardly as viewed in FIG. 1, to effect a maximum stroke. If the disc 17 is rotated anticlockwise from the position shown in FIG. 1, the roller 15 will still travel substantially the full length of the slot 16 as the rider block 12 effects a stroke along the length of the lead screw 11, but the stroke effected by the carrige 6 will be reduced. Except for substantially instantaneous braking and acceleration of the carriage 6 as the needle roller of the rider block 12 changes over from said one screw thread to said other screw thread of the lead screw 11, the speed of travel of the carriage 6 will be uniform since, once the disc 17 has been adjusted to the required angle on the carriage 6 and locked in position, the speed of travel of the carriage is directly proportional to the pitch of the thread of the lead screw 11 and such pitch can be accurately machined to be uniform throughout the length of the lead screw 11. A gear pinion 17a meshes with a toothed segment 17b on the disc 17. By releasing a locking pawl 17c and rotating the pinion 17a the disc 17 can be rotated to adjust the stroke of the carriage 6.

A cam arrangement 7a whereby the squeegee 7 and the distributor blade are alternately raised and lowered need not be described since means for this purpose are well known in the art.

The frame 4 is preferably pivotally mounted about a horizontal axis 18 so that the entire printing head, contained within a casing 19 can be tilted upwardly, for example to remove a substrate jammed in the printing position beneath the printing head.

However it is also desirable that the vertical separation between the table, underlying the screen 1 and on which substrates to be printed are laid, and the printing head, comprising the screen 2 and the squeegee 7, be variable, for example to permit adjustment to suit the thickness of the substrate to be printed.

Adjustment is effected by a motor 20 which through a gear arrangement 21 rotates a disc 22, to opposite sides of which disc 22 are connected transverse tie rods 23 and 24. The tie rods 23, 24 are, at opposite sides of the printing head, connected to radial arms 25 and 26 respectively and the arms 25 and 26 are non-rotatably coupled to concentric shafts 27 and 28 respectively. The cover 19 is mounted at a constant height above the deck on which the substrates are laid to be printed. to adjust the height of the screen 2 above the deck it is therefore necessary to raise or lower the further frame 4 with respect to the casing 19.

Bushes 30 are provided on the further frame 4, which further frame 4 mounts the parallel rods 5 of the carriage 6 and also the frame 3 for the screen 2, and bushes 29 are ridigly fixed to the casing 19. Thus to adjust the height of the further frame 4 with respect to the casing 19, it is necessary to adfjust the height of the bushes 29 with respect to the bushes 28.

At each side of the printing head, within the bushes 29 and 30 are eccentrics 31 and 32 respectively which are non-rotatably secured respectively to the shaft 28 and to the shaft 27. Upon opposite movement of the transverse links 23 and 24 following energisation of the motor 20 and consequent rotation of the disc 22, the radial arms 25 and 26 are each moved as a respective bar linkage to rotate the shafts 27 and 28 respectively. In one direction of rotation of the motor 20, the action of the eccentrics 32 and 31 is to move the bush 30 downwardly with respect to the shafts 27 and 28 and to move the bush 29 upwardly with respect to the shafts 27 and 28. However since the bushes 29 are immovably fixed to the fixed casing 19, the shafts 27 and 28 move upwardly with respect to the fixed bushes 29 and the bushes 30 move upwardly with respect to the shafts 27, 28 thereby to raise the further frame 4 carrying the carriage 6 upwardly by twice the total eccentricity of the eccentrics 31, 32 having regard to the angle through which they have rotated. Rotation of the motor 20 in the opposite direction will cause lowering of the further frame 4.

The speed of the motor 20, the action of the gear box 21, the action of the disc 22 and length of the radial arms 25 and 26 in association with the eccentricity of the eccentrics 31, 32 is such that a very slow movement is obtained and thus the height of the further frame 4 can be very accurately positioned. For example the motor 20 might require operation for two minutes to produce a maximum height adjustment of the further frame 4 of 1½ mm. An indicating scale (not shown) is preferably provided to indicate the instaneous height of the further frame 4 above the deck so that the further frame 4 can readily be returned to a previously set height if desired for ensuring uniform printing performance from the screen printer.

A transducer 33 is preferably provided on the carriage 6 to indicate the pressure applied by the squeegee 7 to the screen 2.

What is claimed is:

1. In a screen printing machine having drive means for reciprocating a carriage mounted squeegee on guide rails, said drive means including a motor driven lead screw and a rider on said lead screw, said lead screw having two oppositely handed threads thereon such that rotation of said drive motor causes reciprocating motion of said rider longitudinally of said lead screw at substantially uniform speed, said rider coupled to said carriage for stroke adjustment of said carriage, the improvement comprising:

stroke adjustment means having a pivotal member pivotally mounted on said carriage and having a slot therein along which said rider can be reciprocated, pivotal movemen tof said pivotal member being effective to adjust the angle of said slot relative to the direction of travel of said rider on said lead screw and thus the stroke of said carriage and of said squeegee with respect to the stroke of said lead screw.

2. An apparatus as in claim 1, wherein said stroke adjustment means further comprises:

a toothed segment on said pivotal member,
   a rotatable pinion gear mounted on said carriage for meshing engagement with said toothed segment, and
   a locking means for preventing rotation of said pinion gear,
   whereby unlocking said pinion gear allows rotation thereof, the meshing of said pinion gear with said toothed segment of said pivotal member causing pivoting thereof to a selected position, and the locking of said pinion gear sets the stroke adjustment.

3. An apparatus as in claim 1, wherein said pivotal member is a disc.

4. An apparatus as in claim 1, wherein said improvement further comprises:

spacing adjustment means for spacing a screen printing head relative to a substrate support, said spacing adjustment means having a pair of coaxial shafts, eccentric members secured on said shafts, bushes secured to respective ones of said members, and means to rotate said shafts such that said eccentric members when rotated in said bushes cause said head to move relative to said substrate support by the sum of the eccentricity of said two eccentric members, having regard to the angle through which said eccentric members are rotated.

5. An apparatus as in claim 4, wherein said means to cause rotation of said shafts comprises generally radially extending rojections from said shafts coupled to tie rods engaged with a motor gear arrangement.

* * * * *